United States Patent [19]

Kusakabe

[11] 4,410,858

[45] Oct. 18, 1983

[54] ELECTRONIC CIRCUIT INCLUDING A CURRENT MIRROR CIRCUIT

[75] Inventor: Hiromi Kusakabe, Yokohama, Japan

[73] Assignee: Tokyo Shibaura Denki Kabushiki Kaisha, Kawasaki, Japan

[21] Appl. No.: 276,161

[22] Filed: Jun. 22, 1981

[30] Foreign Application Priority Data

Jul. 11, 1980 [JP] Japan ................................ 55-94714

[51] Int. Cl.³ ........................... H03F 3/45; H03F 3/18
[52] U.S. Cl. .................................... 330/257; 307/255; 307/355; 307/362
[58] Field of Search ............... 307/355, 356, 358, 362, 307/254, 255, 456, 455; 330/257, 288, 51, 9; 323/315, 316

[56] References Cited

U.S. PATENT DOCUMENTS

| | | | |
|---|---|---|---|
| 4,256,980 | 3/1981 | Asada et al. | 307/254 |
| 4,284,912 | 8/1981 | Fujisaki et al. | 307/255 |
| 4,321,488 | 3/1982 | Srivastava | 307/358 X |
| 4,362,956 | 12/1982 | Ogasawara et al. | 307/355 |

OTHER PUBLICATIONS

L. A. Kaplan et al., "Integral Circuit Stereo Decoder Does Everything", *IEEE Transactions on Broadcast and Television Receivers*, BTR-3, No. 3, pp. 202-212, Aug. 1971.

M. J. Gay, "A Monolithic Phase-Lock-Loop Stereo Decoder," IEEE Transactions on Broadcast and Television Receivers, BTR-17, No. 4, pp. 270-275, Nov. 1971.

*Primary Examiner*—Larry N. Anagnos
*Assistant Examiner*—David Bertelson
*Attorney, Agent, or Firm*—Schuyler, Banner, Birch, McKie & Beckett

[57] ABSTRACT

This disclosed electric circuit substantially eliminates error output which is caused by unbalanced characteristics of a pair of transistors in a current mirror circuit. An input signal is amplified by a differential amplifier. A current mirror circuit is coupled between said differential amplifier and a power supply. Switching means is coupled to said current mirror circuit for cyclically switching input and output points of said mirror circuit.

2 Claims, 5 Drawing Figures

ELECTRONIC CIRCUIT INCLUDING A CURRENT MIRROR CIRCUIT

BACKGROUND OF THE INVENTION

This invention relates to an electronic circuit and more particularly, to a phase comparison circuit and other electronic circuits including a current mirror circuit.

A phase comparison circuit, for example, can utilize an electronic circuit including a current mirror circuit. The circuit can function as a pilot signal detecting circuit in a PLL-MPX (phase locked type-multiplex) decoder IC which demodulates a stereophonic signal. Such a pilot signal detecting circuit is shown in FIG. 1. As shown, a stereophonic signal, which comprises main and sub-audio signals and a pilot signal, is supplied across the base electrodes of transistors $Q_1$, $Q_2$. Transistors $Q_1$, $Q_2$ constitute a differential amplifier 11. After the stereophonic signal is amplified by amplifier 11, it is supplied from the collector electrodes of $Q_1$, $Q_2$ to each common base electrodes of transistors $Q_3$, $Q_4$ and transistors $Q_5$, $Q_6$. Transistors $Q_3$ to $Q_6$ constitute a double balanced differential amplifier 12. A switching signal from a switching signal source 13, which has the same frequency as the pilot signal (e.g., 19KHz) is supplied across the base electrodes of transistors $Q_3$, $Q_6$ and transistors $Q_4$, $Q_5$. Amplifier 12 multiplies the stereophonic signal by the switching signal and produces an output signal from the collector electrodes of transistors $Q_4$, $Q_5$ to an output terminal 15. An AC component in the output signal is supplied to power supply line $L_{11}$ through a condenser $C_{11}$, connected between the terminal 15 and line $L_{11}$. Consequently, a DC level corresponding only to the pilot signal is provided from terminal 15 to a stereo indicative lamp (not shown).

Voltage fluctuation in the power supply are reduced by a current mirror circuit 14, positioned between amplifier 12 and $L_{11}$, which comprises a pair of transistors $Q_7$ and $Q_8$. Although it is desired for transistors $Q_7$, $Q_8$ to have identical characteristics so the current can be balanced, this is generally not possible due to the mass production of transistors. In general, therefore, an error current flows from mirror circuit 14 to output terminal 15. If the current gain of circuit 14 is $1+\epsilon$, the error current flowing into terminal 15 is $(\epsilon/2)I_o$; where $\epsilon$ is the error factor due to the unbalance of transistors $Q_7$, $Q_8$, and $I_o$ is a current value produced by current source $I_{11}$. Source $I_{11}$ is connected to the common emitter electrode of transistors $Q_1$, $Q_2$. In general, $\epsilon$ equals (approximately) $\pm 0.1$; as a result, 5% of the current value $I_o$ is the error output current supplied to terminal 15.

This error output current, however, is not negligible. In the stereophonic signal, the modulation factor of the pilot signal is 10% and that of each audio signal is 90%. Accordingly, the level of each audio signal is nine times the level of the pilot signal. Furthermore, the current value $I_o$ need be large to secure the dynamic range of the stereophonic signal. If $I_o$ is 600 $\mu$A, the variation of the pilot signal becomes approximately $\pm 10$ $\mu$A provided that the upper and lower dynamic ranges of the stereophonic signal is three times the level of the audio signal. If $I_o$ is 600 $\mu$A, then the error signal current becomes approximately $\pm 30$ $\mu$A. Consequently, the output including a large error component, in comparison with the pilot signal, will be supplied from terminal 15 to the stereo indicative lamp even when a stereophonic program is not be received. Accordingly, this high level error signal should not be detected.

SUMMARY OF THE INVENTION

An object of the present invention is to provide an electronic circuit which substantially eliminates the error output current produced by an unbalance of the mirror circuit.

Another object of the present invention is to provide an electronic circuit which can be formed in a integrated semiconductor circuit.

According to the present invention, an electronic circuit comprises: a signal input and output terminals; a differential amplifier having at least one input terminal and a pair of output terminals, the input terminal coupled to said signal input terminal; a first transistor having its collector electrode coupled to one of said output terminals of said differential amplifier; a second transistor having its collector electrode coupled to the other output terminal of said differential amplifier, its base electrode coupled to the base electrode of said first transistor; a first switching means having a movable contact, a first stationary contact, and a second stationary contact, its movable contact coupled to the base electrode of said first transistor, its first stationary contact coupled to the collector electrode of said first transistor, and its second stationary contact coupled to the collector electrode of said second transistor; second switching means having a movable contact, first stationary contact and a second stationary contact, its movable contact coupled to said signal output terminal, its first stationary contact coupled to the collector electrode of said first transistor, and its second stationary contact coupled to the collector electrode of said second transistor; and, a control means for cyclically controlling the positioning of said movable contacts of said first and second switching means between said first and second stationary contacts.

The objects and advantages of the present invention will become apparent to persons skilled in the art from a study of the following description and the accompanying drawings.

DESCRIPTION OF THE PREFERRED EMBODIMENT

Figure 1:
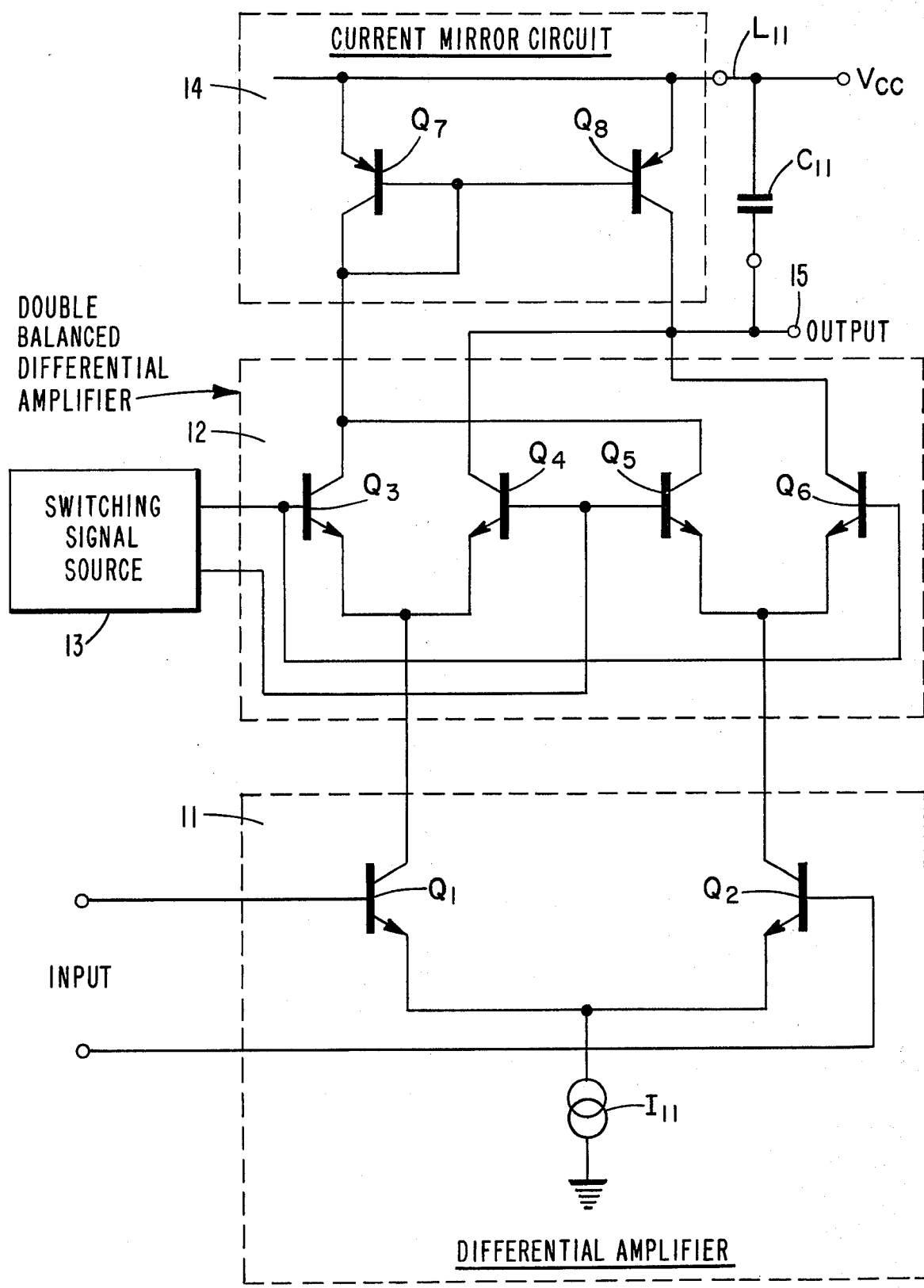
FIG. 1 is a schematic circuit diagram of a conventional phase comparison circuit.

The present invention will be described in detail with reference to the accompanying drawings. Throughout the drawings, like reference numerals will be used to designate like or equivalent portions, for simplicity of explanation.

Figure 2:
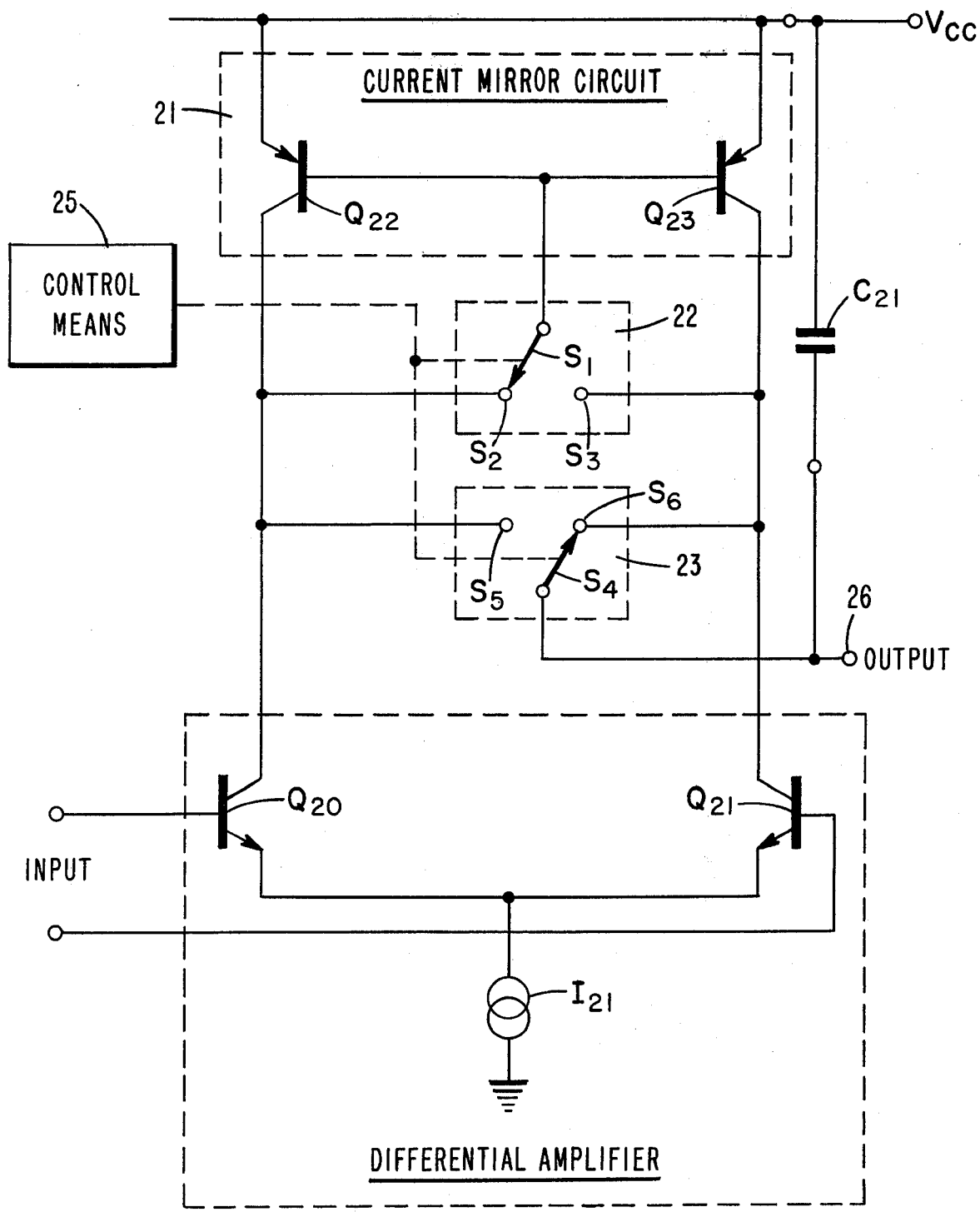
FIG. 2 is a schematic circuit diagram explaining the operation and construction of an electronic circuit according to the present invention, for example, shown in FIGS. 3-4.

The fundamental constitution of an electronic circuit according to the present invention is shown in FIG. 2.

An input signal is applied across the base electrodes of transistors $Q_{20}$ and $Q_{21}$ which form a differential amplifier 20. Their emitter electrodes are grounded through a common current source $I_{21}$.

An amplified signal is supplied from the collector electrode of each transistor $Q_{20}$, $Q_{21}$ to a current mirror circuit 21 comprising transistors $Q_{22}$ and $Q_{23}$. The collector electrode of transistor $Q_{22}$ is coupled to the collector electrode of transistor $Q_{20}$, while its emitter electrode is coupled to a power supply line 24. The collector electrode of transistor $Q_{23}$ is coupled to the collector electrode of transistor $Q_{21}$, while its base electrode is coupled to the base electrode of transistor $Q_{23}$, and its emitter electrode is coupled to line 24. A first switching means 22 has a movable contact $S_1$ coupled to base electrode of the transistor $Q_{22}$, its stationary contact $S_2$ coupled to the collector electrode of transistor $Q_{22}$, and its stationary contact $S_3$ coupled to the collector electrode of transistor $Q_{23}$. A second switching means 23 has a movable contact $S_4$ coupled to a signal output terminal 26, its stationary contact $S_5$ coupled to the collector electrode of transistor $Q_{22}$, and its stationary contact $S_6$ coupled to the collector electrode of transistor $Q_{23}$. A capacitor $C_{21}$ is connected between terminal 26 and line 24 to average the output supplied by contact $S_4$. The movement of contacts $S_1$, $S_4$ are cyclically controlled by a control means 25 as follows: movable contact $S_4$ contacts stationary contact $S_6$ at the time movable contact $S_1$ contacts stationary contact $S_2$. During the time, however, movable contact $S_4$ contacts stationary contact $S_5$, movable contact $S_1$ contacts stationary contact $S_3$. As a result, the error current flowing into output terminal 26 is reduced from $(\epsilon/2) I_o$, as in the prior art circuit, to $$\frac{I_o}{4} \cdot \frac{\epsilon^2}{(1+\epsilon)},$$

as will be developed in detail below.

The error output current supplied to output terminal 26 is as follows: It is assumed that the error factor of circuit 21, due to the unbalance of transistors $Q_{22}$ and $Q_{23}$, is $\epsilon$. Control means 25 is a count-down circuit for producing a symmetric square wave output having a one-half duty cycle. When contact $S_1$ contacts contact $S_2$, and contact $S_4$ contacts contact $S_6$, the current gain of the circuit 21 is $1+\epsilon$. When, alternately, contact $S_1$ contacts contact $S_3$, and contact $S_4$ contacts with contact $S_5$, the current gain of circuit 21 becomes $$\frac{1}{1+\epsilon}.$$

Consequently, the error output current, which is averaged by condenser $C_{21}$ and supplied to the terminal 26, is $$\frac{1}{2}\left[\left\{\frac{I_o}{2}\left(\frac{1}{1+\epsilon}\right) - \frac{I_o}{2}\right\} + \frac{I_o}{2}\epsilon\right] = \frac{I_o}{4} \cdot \frac{\epsilon^2}{(1+\epsilon)}$$

where $I_o$, is a value of current supplied from current source $I_{21}$.

When $\epsilon$ is 0.1 the error output current is approximately $0.00227 I_o$, namely, 0.23% of the current $I_o$. Now, if the current $I_o$ is 600 $\mu$A, the error output current becomes approximately 1.38 $\mu$A. Accordingly, when compared with the error output current of the prior art circuit (i.e., 30 $\mu$A), the error current is substantially reduced.

Figure 3:
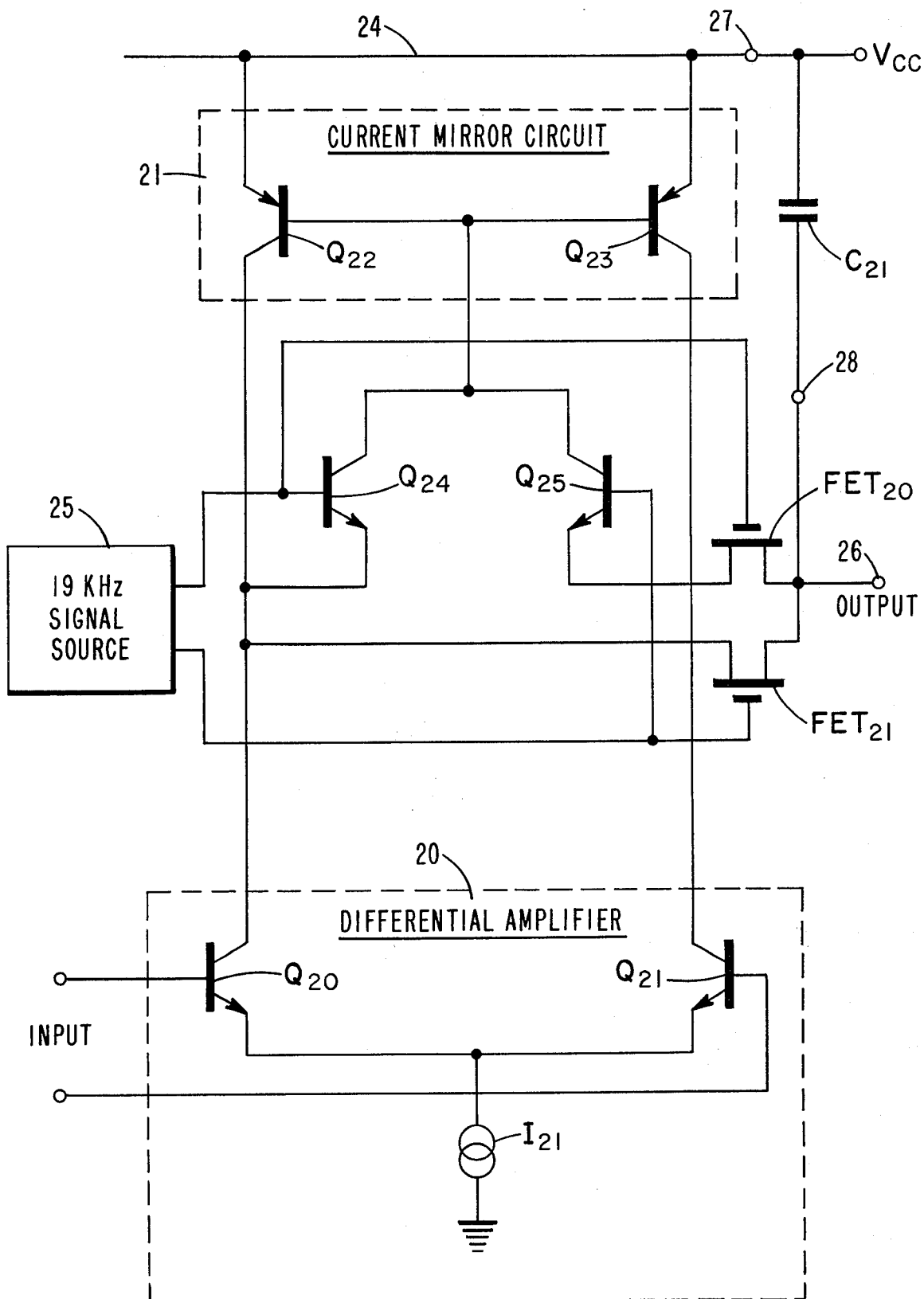
FIG. 3 is a schematic circuit diagram of a phase comparison circuit according to the present invention.

This invention, for example, may be applied to a pilot signal detecting circuit in a PLL-MPX decoder IC which demodulates a stereophonic signal. Such a pilot signal detecting circuit is shown in FIG. 3. As shown, a stereophonic signal, comprising a main and sub-audio signals and a pilot signal (19 KHz), is applied across the base electrodes of transistors $Q_{20}$, $Q_{21}$ which form a differential amplifier 20. After the stereophonic signal is amplified by the amplifier 20, it is supplied from the collector electrodes of transistors $Q_{20}$, $Q_{21}$ to the respective collector electrode of transistors $Q_{22}$ and $Q_{23}$. Transistors $Q_{22}$, $Q_{23}$ constitute a current mirror circuit 21. The emitter electrode of transistor $Q_{22}$ is connected to a power supply line 24, while its base electrode is connected to the base electrode of transistor $Q_{23}$. The emitter electrode of transistor $Q_{23}$ is connected to line 24. The collector electrodes of transistors $Q_{24}$, $Q_{25}$ are connected to the base electrode of transistor $Q_{22}$. The emitter electrode of transistor $Q_{24}$ is connected to the collector electrode of transistor $Q_{22}$, while its base electrode is connected to the gate electrode of a field-effect transistor $FET_{20}$. The source electrode of transistor $FET_{20}$ is connected to the collector electrode of transistor $Q_{23}$, while its drain electrode is connected to an output terminal 26 and to line 24 through a condenser $C_{21}$. The emitter electrode of transistor $Q_{25}$ is connected to the collector electrode of transistor $Q_{23}$, while its base electrode is connected to the gate electrode of a field-effect transistor $FET_{21}$. The source electrode of $FET_{21}$ is connected to the collector electrode of transistor $Q_{22}$, while its drain electrode is connected to terminal 26. Transistors $Q_{24}$, $Q_{25}$, $FET_{20}$ and $FET_{21}$ function as switching means 22, 23 (FIG. 2).

One of a pair of output terminals of a 19KHz signal source 25 (e.g., symmetrical square wave) is connected to the base electrode of transistor $Q_{24}$. The other terminal of source 25 is connected to the base electrode of transistor $Q_{25}$. Source 25 functions as control means 25 (FIG. 2). As a result of the positive periodic output of source 25, transistor $Q_{24}$, $FET_{20}$ conduct while transistors $Q_{25}$, $FET_{21}$ are cut off. During the negative periodic output of source 25, transistors $Q_{24}$, $FET_{20}$ are cut off while transistors $Q_{25}$, $FET_{21}$ conduct. A DC signal, have very little error component and corresponding only to the pilot signal, is provided from terminal 26 to a stereo indicative lamp (not shown). Except for connection pin 27 for line 24, this circuit has only one outside connection pin 28 (i.e., for condenser $C_{21}$); consequently, it may be easily fabricated into a semiconductor integrated circuit.

Figure 4:
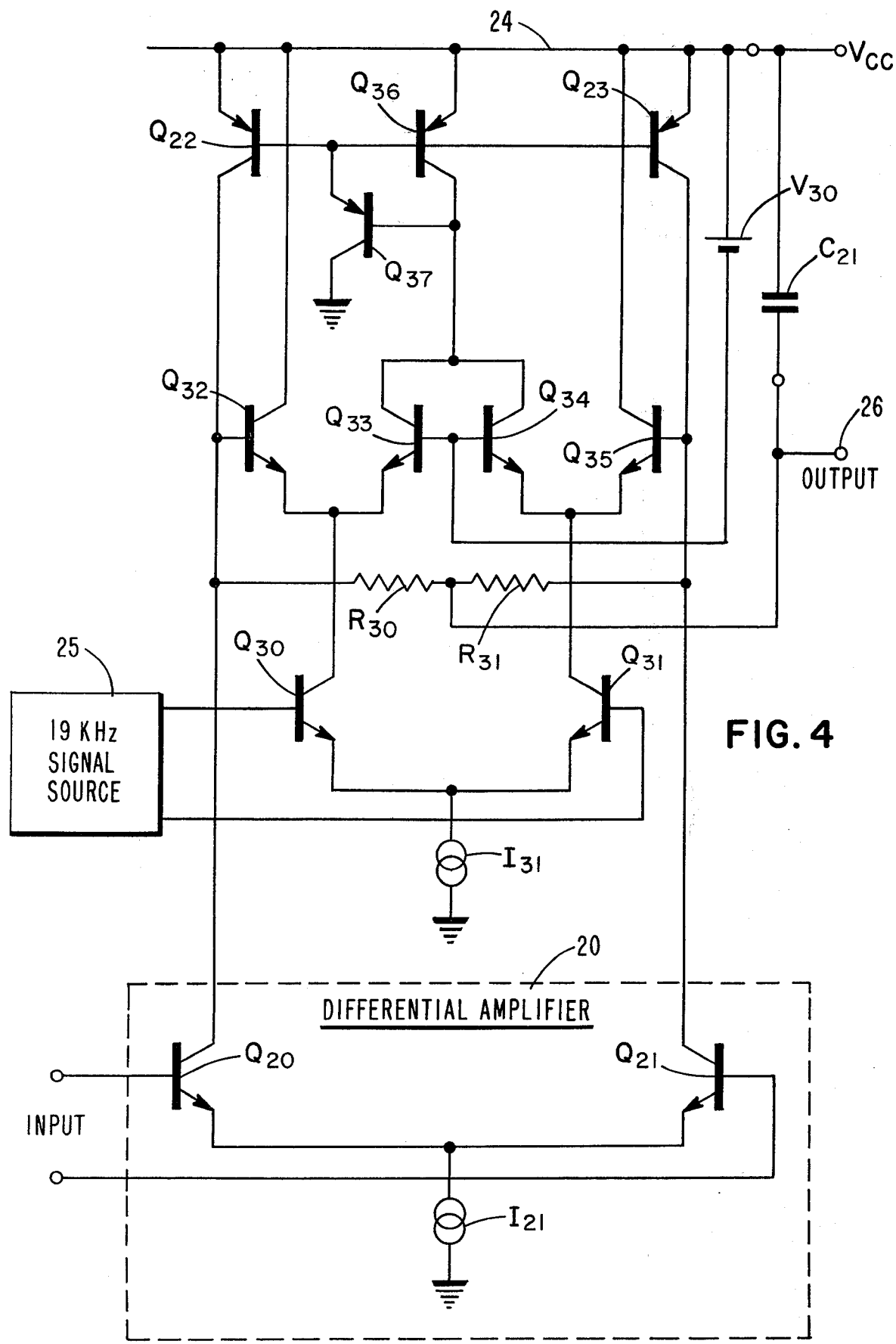
FIG. 4 is a schematic circuit diagram of another embodiment of a phase comparison circuit according to the present invention.

Another embodiment of the pilot signal detecting circuit according to the present invention is shown in FIG. 4. For simplicity of explanation, portions similar to the circuit of FIG. 3 have been omitted. The base electrode of a transistor $Q_{30}$ is connected to one output terminal of 19KHz signal source 25. The base electrode of a transistor $Q_{31}$ is connected to the other terminal of source 25. The emitter electrodes of transistors $Q_{30}$, $Q_{31}$ are grounded through a common current source $I_{31}$. The emitter electrodes of transistors $Q_{32}$, $Q_{33}$ are connected to the collector electrode of transistor $Q_{30}$, while the base electrode of transistor $Q_{32}$ is connected to the collector electrode of transistor $Q_{22}$. The collector electrode of transistor $Q_{32}$ is connected to power supply line 24. The collector electrode of transistor $Q_{33}$ is connected to the collector electrode of a transistor $Q_{36}$ and the base electrode of a transistor $Q_{37}$. The base electrode of transistor $Q_{36}$ is connected to the base electrode of transistor $Q_{22}$, while its emitter electrode is connected to line 24. The emitter electrode of transistor $Q_{37}$ is connected to the base electrode of transistor $Q_{22}$, while its collector electrode is grounded. The emitter electrodes of transistors $Q_{34}$, $Q_{35}$ are connected to the collector electrodes of transistor $Q_{31}$. The base electrode of transistor $Q_{35}$ is connected to the collector electrode of transistor $Q_{23}$, while its collector electrode is connected to line 24. The base electrode of transistor $Q_{34}$ is connected to the base electrode of transistor $Q_{33}$ and a negative electrode of a reference voltage source $V_{30}$. A positive electrode of source $V_{30}$ is connected to line 24. The collector electrode of transistor $Q_{34}$ is connected to the collector electrode of transistor $Q_{33}$. Transistors $Q_{30}$ to $Q_{37}$ function as switching means 22 (FIG. 2). Rather than utilizing a switching circuit for means 23 as shown in FIG. 2, FIG. 4 employs serially connected resistors $R_{30}$, $R_{31}$, connected between the collector electrodes of transistors $Q_{22}$, $Q_{23}$, to perform a similar function. In this case, the output signal is divided by resistors $R_{30}$ and $R_{31}$ to reduce the error signal.

As a result of the output of source 25, transistors $Q_{30}$, $Q_{31}$ conduct alternatively. During the positive cycle of source 25 when transistor $Q_{30}$ conducts and transistor $Q_{31}$ is cut off, transistors $Q_{32}$, $Q_{33}$ conduct and transistors $Q_{34}$, $Q_{35}$ are cut off. During the negative cycle of source 25 when transistor $Q_{30}$ is cut off and transistor $Q_{31}$ conducts, transistors $Q_{32}$, $Q_{33}$ are cut off and transistors $Q_{34}$, $Q_{35}$ conduct.

Figure 5:
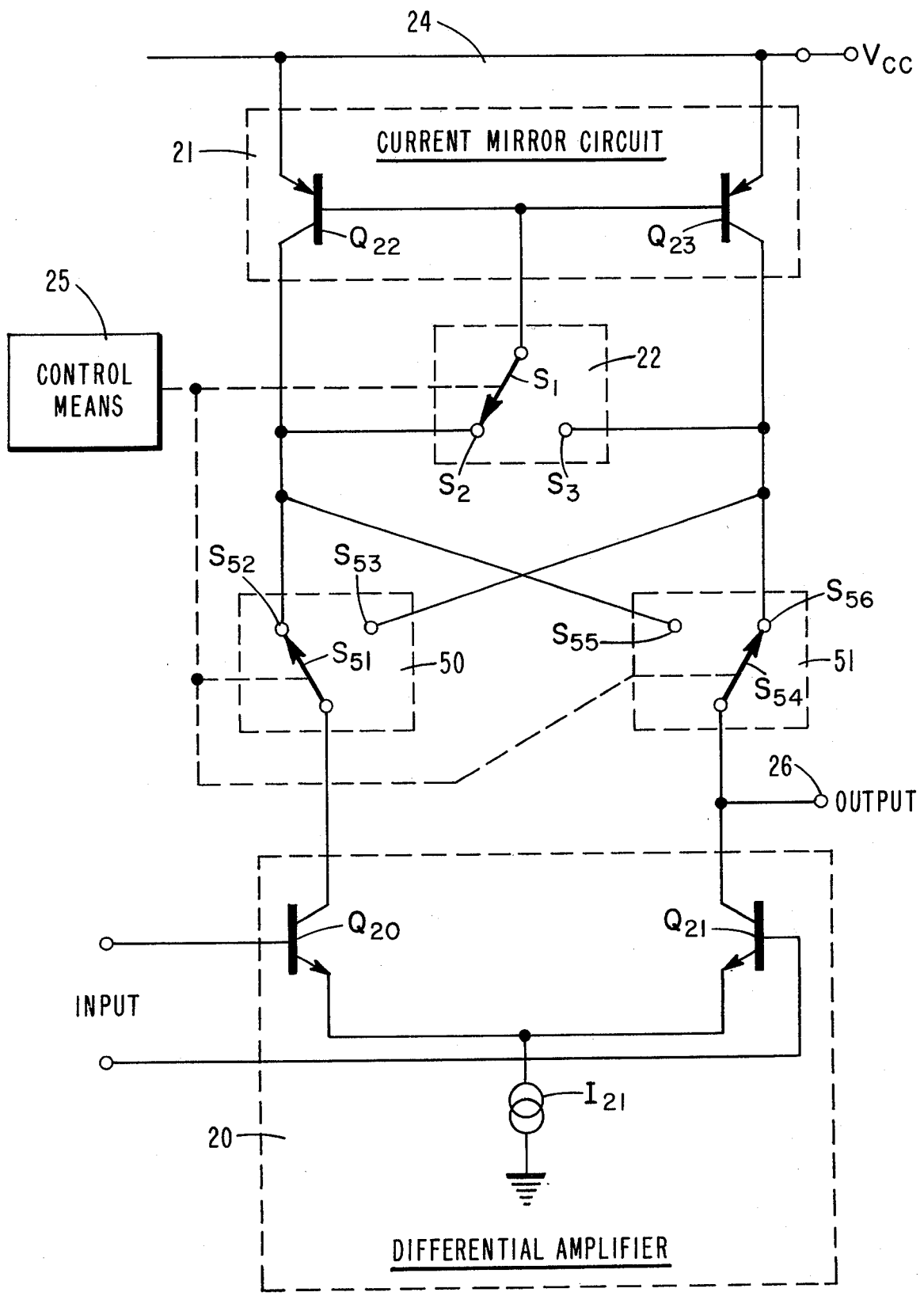
FIG. 5 is a schematic circuit diagram explaining the operation and constitution of a modification of an electronic circuit according to the present invention.

A modification of the electronic circuit according to the present invention is shown in FIG. 5. For example, this circuit can be used as an operational amplifier. As shown, a small offset input voltage is applied across the base electrodes of transistors $Q_{20}$, $Q_{21}$ which constitute a differential amplifier 20. The emitter electrodes of transistors $R_{20}$, $R_{21}$ are grounded through a common current source $I_{21}$. The collector electrode of transistor $Q_{20}$ is connected to a switching means 50. Switching means 50 has a movable contact $S_{51}$ connected to the collector electrode of a transistor $Q_{20}$, its stationary contact $S_{52}$ connected to the collector electrode of a transistor $Q_{22}$, and its stationary contact $S_{53}$ connected to the collector electrode of a transistor $Q_{23}$. The collector electrode of transistor $Q_{21}$ is connected to a switching means 51 and an output terminal 26. Switching means 51 has a movable contact $S_{54}$ connected to the collector electrode of the transistor $Q_{21}$, its stationary contact $S_{56}$ connected to the collector electrode of transistor $Q_{23}$ and its stationary contact $S_{55}$ connected to the collector electrode of transistor $Q_{22}$. As shown in the previous embodiments, transistors $Q_{22}$, $Q_{23}$ constitute a current mirror circuit 21. The emitter electrode of transistor $Q_{22}$ is connected to a power supply line 24, while its base electrode is connected to the base electrode of transistor $Q_{23}$. The emitter electrode of transistor $Q_{23}$ is connected to line 24. A switching means 22 has its movable contact $S_1$ connected to the base electrode of transistor $Q_{22}$, its stationary contact $S_2$ connected to the collector electrode of transistor $Q_{22}$, and its stationary contact $S_3$ connected to the collector electrode of transistor $Q_{23}$. The movements of contacts $S_1$, $S_{51}$ and $S_{54}$ are cyclically controlled by a switching signal from a control means 25, which has a higher frequency than the input signal. During the time movable contact $S_1$ contacts stationary contact $S_2$, movable contact $S_{51}$ contacts stationary contact $S_{52}$ and movable $S_{54}$ contacts stationary contact $S_{56}$. During the time, however, movable contact $S_1$ contacts stationary contact $S_3$, movable contact $S_{51}$ contacts stationary contact $S_{53}$, and movable contact $S_{54}$ contacts stationary contact $S_{55}$.

It should be readily apparent to a person skilled in the art that this invention can be employed in various types of electronic circuits including, for example, a phase comparator circuit in a FM quadrature detecting circuit, a AM synchronous detecting circuit and a phase-locked loop circuit.

I claim:

1. An electronic circuit having signal input and output terminals, said electronic circuit comprising:
   a differential amplifier having at least one input terminal and a pair of output terminals, the input terminal being coupled to said signal input terminal;
   a first transistor having base, emitter and collector electrodes, the collector electrode being coupled to one of said differential amplifier output terminals;
   a second transistor having base, emitter and collector electrodes, the collector electrode being coupled to the other of said differential amplifier output terminals, the base electrode being coupled to the base electrode of said first transistor; said emitter electrodes of said first and second transistors being coupled together to a source of potential;
   first switching means for connecting the base electrode of said first transistor to the collector electrode of said first transistor during a first time period, and to the collector electrode of said second transistor during a second time period;
   second switching means for connecting said signal output terminal to the collector electrode of said second transistor during said first time period; and to the collector electrode of said first transistor during said second time period; and,
   control means for cyclically controlling the switching of said first and second switching means.

2. The electronic circuit of claim 1 further comprising:
   a third switching means for connecting said one output terminal of said differential amplifier to the collector electrode of said first transistor during said first time period, and to the collector electrode of said second transistor during said second time period; and
   said control means coupled to said third switching means for cyclically controlling the switching of said third switching means.

* * * * *